United States Patent [19]

Turner et al.

[11] Patent Number: 4,680,474
[45] Date of Patent: Jul. 14, 1987

[54] METHOD AND APPARATUS FOR IMPROVED ION DOSE ACCURACY

[75] Inventors: Norman L. Turner, Gloucester; John D. Pollock, Rockport, both of Mass.

[73] Assignee: Varian Associates, Inc., Palo Alto, Calif.

[21] Appl. No.: 736,888

[22] Filed: May 22, 1985

[51] Int. Cl.⁴ .............................................. H01J 37/18
[52] U.S. Cl. ............................. 250/492.2; 250/441.1; 414/217
[58] Field of Search ............. 250/492.21, 492.2, 441.1, 250/289; 414/217, 220, 221

[56] References Cited

U.S. PATENT DOCUMENTS 4,449,885  5/1984  Hertel et al. ..................... 414/750

OTHER PUBLICATIONS

K. Steeples, "Dose Control with High Power Ion Beams on Photoresist Masked Targets", *J. Vac. Sci. Technol.* B2(1), Jan.–Mar. 1984, pp. 58–62.
G. Ryding et al., 10th International Conference on Electron and Ion Beam Science and Technology, Montreal (1982), pp. 366–371.
G. Ryding et al., "Dose Control for Ion Implantation", Microelectronic Manufacturing and Testing", Feb. 1983, pp. 17–19.
G. Ryding, Poceedings of the Fourth International Conference on Ion Implantation Equipment and Techniques, Springer Verlag (1983), pp. 274–290.

*Primary Examiner*—Bruce C. Anderson
*Assistant Examiner*—Jack I. Berman
*Attorney, Agent, or Firm*—Stanley Z. Cole; William R. McClellan

[57] ABSTRACT

The implant chamber pressure during ion implantation is controlled within a specified intermediate pressure range higher than the baseline pressure. Implanted dose errors resulting from neutralizing collisions of the beam with residual gas molecules are held constant and can be compensated. The pressure is maintained within the specified intermediate pressure range by a control system including a controllable vacuum valve associated with a vacuum pump, a chamber pressure sensor and a valve controller responsive to the pressure sensor. The valve controller opens and closes the valve to maintain the chamber pressure within the specified range after introduction of a wafer.

8 Claims, 3 Drawing Figures

METHOD AND APPARATUS FOR IMPROVED ION DOSE ACCURACY

BACKGROUND OF THE INVENTION

This invention relates to ion implantation and, more particularly, to methods and apparatus for improving ion implanatation dose accuracy by reducing measurement errors due to pressure variations in the implant chamber.

Ion implantation has become a standard technique for introducing impurity dopants into semiconductor wafers. A beam of ions is generated in a source and is directed with varying degrees of acceleration toward a target wafer. The ions implanted into the semiconductor material form the various elements of an integrated circuit. Ion Implantation systems typically include an ion source, ion optics for removing undesired ion species and for focusing the beam, means for deflecting the beam over the target area, and an end station for mounting and exchanging wafers. The entire region between the ion source and the semiconductor wafer is maintained at high vacuum to prevent dispersion of the ion beam by collisions with gas molecules.

In commercial ion implantation systems, wafers are introduced into a vacuum ion implantation chamber through an isolation lock, are implanted and then are removed through the isolation lock. In some systems, the wafers remain in the isolation lock and are implanted through an open gate valve. Prior to implantation, the vacuum chamber is maintained at a prescribed baseline pressure level by a vacuum pumping system. When a wafer is introduced into the chamber through the isolation lock, a substantial increase in pressure occurs due to gas introduced with the wafer and outgassing of the wafer and lock surfaces. When the ion beam is applied to the wafer, another pressure increase occurs, due in part to the presence of the ion beam in the chamber, and in part to particles dislodged from the wafer by impact of the ion beam. The gas responsible for the pressure increase, or pressure burst, is removed by the vacuum pumping system, so as to reduce the pressure at a rate determined by several factors described hereinafter. In order to achieve high throughput with the ion implantation system, it is impractical to wait until the pressure has returned to its baseline level. Typically, ion implantation can be performed at a pressure which is an order of magnitude above the baseline pressure. Thus, implantation is begun shortly after the wafers are introduced into the chamber, and, as implantation proceeds, the chamber pressure is gradually reduced.

In the fabrication of microminiature integrated circuits, it is important to implant precisely measured quantities of impurity dopants to achieve predictable device performance. Ion implanters customarily utilize a Faraday charge collection system to measure the ion dosage. In such a system, the wafer is positioned in a Faraday cage which detects the charged particles in the ion beam. The measurement is integrated over time to obtain a measurement of total ion dosage applied to the wafer.

However, the Faraday system accuracy is sensitive to pressure. The residual gas in the vacuum chamber produces errors in the measured dose due to collisions between ions in the beam and residual gas molecules outside the Faraday system. When these collisions occur, some of the ions in the beam are neutralized. Since the Faraday system registers dopant atoms only if they carry an electrical charge, the Faraday system is not able to measure the neutralized portion of the ion beam, and a dose error is introduced. The magnitude of the error depends on the number of neutralizing collisions and, hence, upon the chamber pressure.

Since ion implantation is usually performed during vacuum pumping of gas introduced with the target wafers, the pressure is variable and determination of resulting dose errors is difficult. Several factors cause the pressure level as a function of time during the implant to be unpredictable. Some of these factors are as follows:

(1) The pressure varies with ion beam current.

(2) The pressure at any instant depends on the rate of vacuum pumping, which can vary for a number of reasons.

(3) Undesired leakage into the vacuum chamber causes variations in the pressure versus time curve.

(4) Variations in wafer outgassing, such as water vapor, and particularly outgassing by photoresist mask layers applied to the wafers.

(5) The time of the implant affects the final pressure reached.

(6) Chamber contamination can cause variations in pressure.

The pressure during implantation will vary depending on the above factors, thereby causing an error between the actual dose and the measured dose. In the past, Faraday system designs have been proposed which exhibit reduced sensitivity to chamber pressure. However, it is desired to improve dose accuracy regardless of Faraday system configuration.

It is a general object of the present invention to provide novel ion implantation apparatus and methods.

It is another object of the present invention to provide methods and apparatus for improving the accuracy of ion implanted impurity dosage.

It is still another object of the present invention to provide methods and apparatus for reducing pressure variations during ion implantation.

SUMMARY OF THE INVENTION

According to the present invention, these and other objects and advantages are achieved in ion implantation apparatus comprising a processing chamber, means for evacuating the chamber to a baseline pressure, means for introducing a workpiece into the chamber, thereby causing an undesired increase in chamber pressure, means for directing a beam of positively charged ions at the workpiece, and means for controlling the pressure in the chamber after introduction of the workpiece within a specified intermediate pressure range higher than the baseline pressure, thereby reducing pressure variations during implantation.

According to another aspect of the invention, there is provided a method for ion implantation comprising the steps of evacuating a processing chamber to a baseline pressure, introducing a workpiece into the chamber thereby causing an increase in pressure, directing a beam of positively charged ions at the workpiece, and controlling the pressure in the chamber after introduction of the workpiece within a predetermined intermediate pressure range higher than the baseline pressure thereby reducing pressure variations during implantation.

BRIEF DESCRIPTION OF THE DRAWINGS

For a better understanding of the present invention, together with other and further objects, advantages, and capabilities thereof, reference may be had to the accompanying drawings which are incorporated herein by reference, and in which.

DETAILED DESCRIPTION OF THE INVENTION

Figure 1:
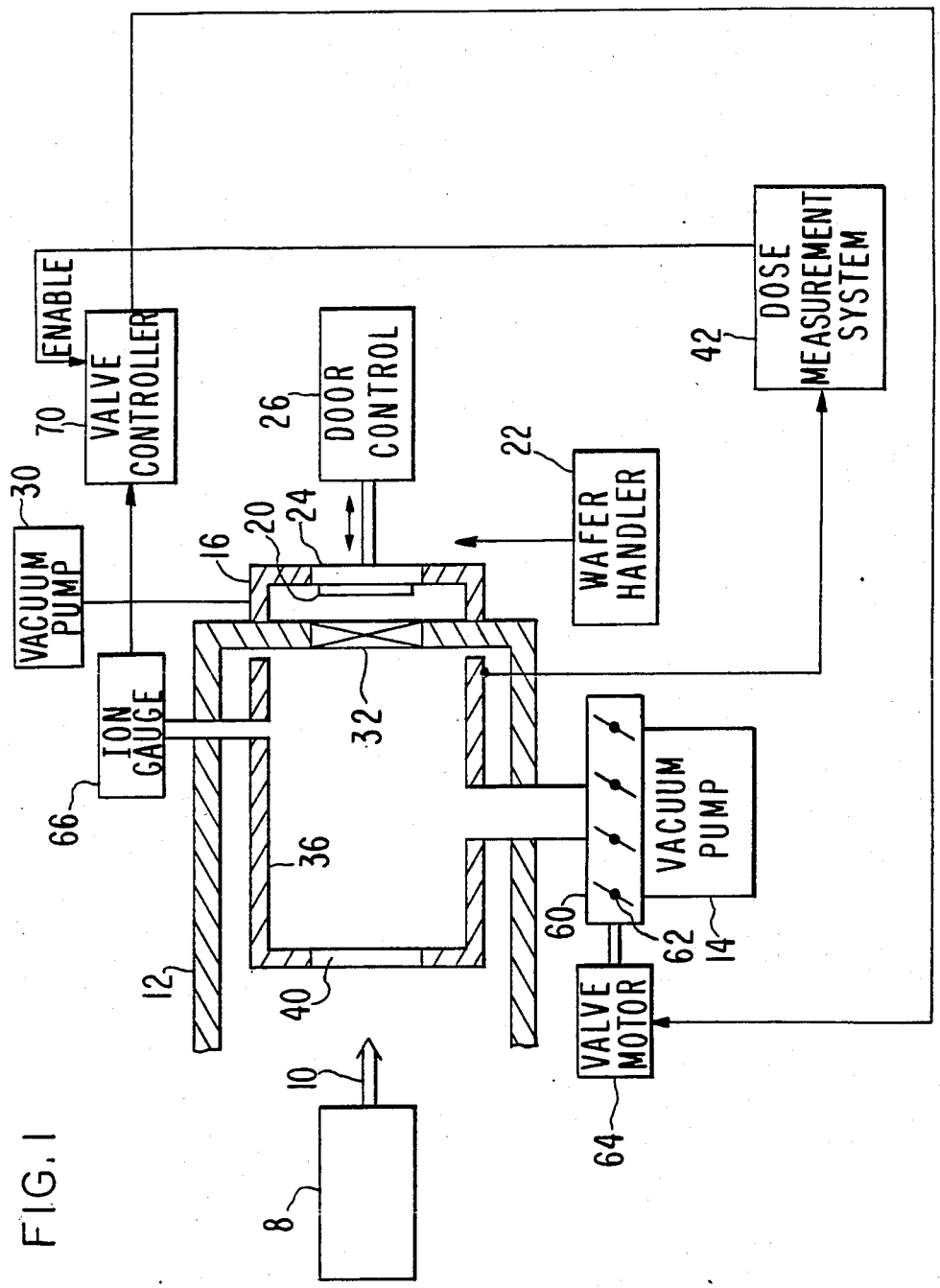
FIG. 1 is a simplified schematic diagram of the apparatus in accordance with the present invention.

An end station for a serial ion implantation system in accordance with the present invention is shown in simplified form in FIG. 1. An ion beam 10 is generated in an ion source, is accelerated to the desired energy, typically 10 to 200 KeV, is momentum analyzed to remove undesired ion species, and is focused in the plane of the target wafer. The ion source and ion optical elements are shown schematically at 8. In a serial system which implants one wafer at a time, the ion beam is electrostatically scanned over the area of the wafer to provide uniform dosage per unit area. Other systems utilize mechanical scanning of the wafer or a combination of mechanical scanning and beam deflection to distribute the ion dosage. The scanning technique is not relevant to the present invention. Systems for generating the ion beam 10 are well known in the art and are commercially utilized in ion implantation equipment. The entire region traversed by the ion beam, between the source and the wafer, is enclosed by a vacuum chamber 12, which is evacuated by a vacuum pumping system. The end station is evacuated by a vacuum pump 14. Semiconductor wafers are introduced into the vacuum chamber 12 through an isolation lock 16, are processed by the ion beam 10 and are removed from the chamber through the isolation lock 16. A semiconductor wafer 20 is lifted from a cassette wafer holder (not shown) by a wafer handler 22 and is clamped on a chamber door 24. The chamber door 24 is sealed to the isolation lock 16 by a door control 26. The lock 16 is then evacuated by a roughing vacuum pump 30; and a gate valve 32 between the lock 16 and the vacuum chamber 12 is opened. The operation of the wafer handling system is shown and described in more detail in U.S. Pat. No. 4,449,885. The system is typically provided with a beam gate (not shown) for preventing the beam from reaching the target wafer except during the implant cycle.

A Faraday charge collection system 36 is mounted to receive the ion beam 10 through an aperture 40. The wafer 20 is positioned at the downstream end of the Faraday system 36 and forms part of the charge collection surface. The Faraday system 36 is electrically isolated from the vacuum chamber 12 and is connected to a dose measurement system 42. The Faraday system 36 operates by sensing the charges in the ion beam and converting the charges to a current. The current is sensed and integrated over time by the dose measurement system 42 to provide a measurement of the cumulative impurity dosage implanted in the wafer 20. Typically, when a prescribed dosage is reached, ion implantation of the wafer is automatically terminated. The use of erroneous measured dose information to determine the implant end point results in actual dose errors in the target wafers. In the fabrication of microminiature integrated circuit devices, high dose accuracy is necessary to achieve predictable device performance. Therefore, the reduction of dose measurement errors is an important objective.

One of the variables affecting the accuracy of the measured dose is the pressure in the implant chamber. Collisions between ions in the beam and residual gas molecules can produce neutral atoms which are not registered by the Faraday system, although such neutral atoms are implanted into the target wafer and affect wafer properties. Neutralizing collisions, therefore, cause errors in the measured dose, the magnitude of which increases as the pressure of the residual gas increases. For given pressure level and ion beam current, a correction factor can be added to the measured dose. However, in the typical production ion implanter, the pressure varies during implantation, thereby making it impractical to compensate for errors in real time by the use of correction factors.

Figure 2:
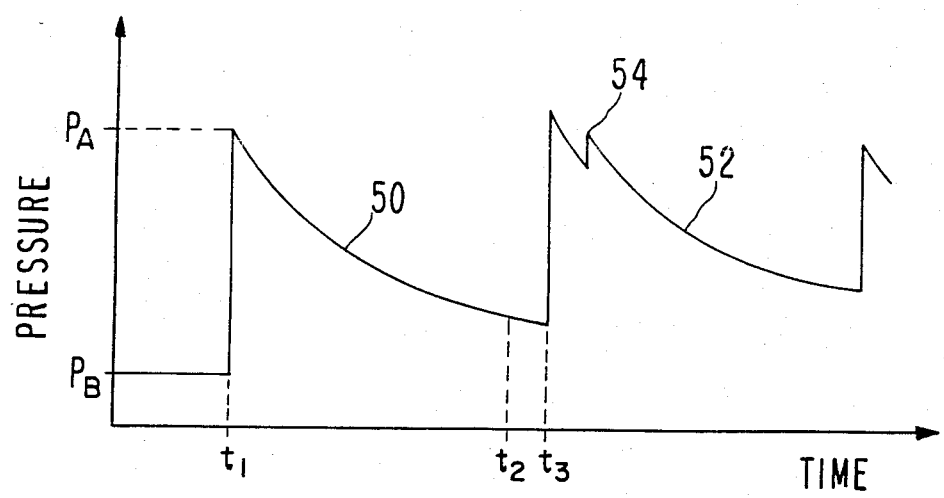
FIG. 2 is a graphic representation of pressure as a function of time in prior art ion implanters.

The pressure variation during ion implantation in accordance with prior art techniques is illustrated graphically in FIG. 2. The baseline pressure $P_B$ is the pressure level obtained in the vacuum chamber 12 after operation of the vacuum pumping system for an extended period of time. At time $t_1$, the gate valve 32 is opened to expose a wafer for implantation and the pressure rapidly rises to a level $P_A$ due to the introduction of gas from the isolation lock 16. The pressure is reduced by operation of the vacuum pump 14, as shown by the curve 50 in FIG. 2, until an equilibrium pressure is reached. During this time, the wafer is implanted, and dose is monitored by the dose measurement system 42. It is assumed that, during the time $t_1$ to $t_2$, the pressure indicated by curve 50 is within a range which is acceptable for ion implantation. If this is not the case, it is necessary to delay the start of the implant until the pressure is reduced to an acceptable level. At time $t_2$, implantation is completed and the gate valve 32 is closed for exchange of wafers. At time $t_3$, the gate valve is reopened and a new wafer is exposed for ion implantation. It can be seen that the pressure during ion implantation is variable, thereby causing a time-varying dose error.

Furthermore, the pressure in the chamber does not always follow the curve 50 during ion implantation. The pressure-time curve depends both on the quantity of gas in the chamber and the rate of vacuum pumping. The rate of pumping is more or less fixed, except for long term aging effects. However, the quantity of gas depends on beam current, chamber leakage, wafer outgassing, chamber outgassing and gas introduced from the isolation lock, all of which are variable to some extent. This variability is illustrated in FIG. 2 by the curve 52 which represents the pressure during implantation of a second wafer. The initial pressure after opening of the gate valve is higher than for the previous wafer since more gas was introduced. In addition, a pressure burst 54 occurs when the beam is applied to the wafer, due to the presence of a photoresist masking layer on the wafer. The photoresist outgassing effect is well known to those skilled in the art. The curve 52 is, therefore, shifted upwards in relation to the curve 50, resulting in a different dose measurement error.

Figure 3:
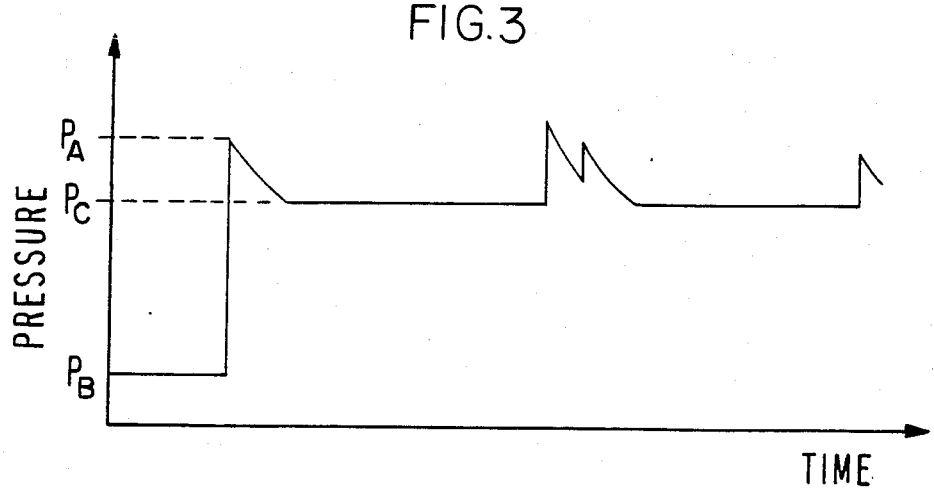
FIG. 3 is a graphic representation of pressure as a function of time of the apparatus shown in FIG. 1.

In accordance with the present invention, the pressure in the chamber during ion implantation of a wafer is prevented from going below a predetermined intermediate pressure level $P_C$ which is higher than the baseline pressure $P_B$. With reference to FIG. 3, the pressure $P_C$ is intermediate the baseline pressure $P_B$, and the pressure $P_A$, which occurs after opening of the gate valve 32. After opening the gate valve 32, the chamber pressure is reduced by the vacuum pump 14 until the pressure $P_C$ is reached. Preferably, the implant is not started until the chamber pressure reaches the level $P_C$. Alternatively, if somewhat greater dose error is acceptable, the implant can be started before the chamber pressure reaches the level $P_C$. The pressure is then controlled within prescribed limits at the level $P_C$ until completion of the implant. Therefore, the variations in pressure described hereinabove are, to a large extent, eliminated.

Apparatus for maintaining the pressure at the level $P_C$ is shown in FIG. 1. A controllable vacuum valve 60 is connected in the conduit between the vacuum chamber 12 and the vacuum pump 14. The vacuum valve 60 includes means for controlling the flow of gas between the chamber 12 and the vacuum pump 14. In the present example, the valve 60 includes vanes 62 which can be turned to block flow of gas into the vacuum pump 14 or turned to permit free flow of gas. The position of the vanes 62 is controlled by a valve motor 64. An example of a vacuum valve 60 is a type 253 Exhaust Valve available from MKS Instruments, Inc. A pressure sensor 66, such as an ion gauge is connected to measure the pressure in the chamber 12. A signal representing the measured pressure is supplied to a valve controller 70, the output of which is coupled to the valve motor 64. The valve controller 70 also receives an enable input from the dose measurement system 42, which enables its operation after a wafer is introduced into the chamber. The controller 70 is inhibited after completion of the implant. A pressure set level input establishes the level $P_C$ at which the pressure is controlled. The intermediate pressure level $P_C$ can be controlled at a fixed level with a linear control system or can be controlled to remain within prescribed upper and lower limits in accordance with known control techniques.

In operation, the valve controller 70 receives a signal representative of the pressure in the chamber 12 from the pressure sensor 66. The pressure signal is compared with a reference level representative of the desired pressure $P_C$. When the pressure in the chamber is above the reference level, the valve controller 70 provides a signal to the valve motor 64 to open the valve 60, thereby allowing maximum vacuum pumping of the chamber 12. When the pressure reaches the level $P_C$, the valve controller 70 provides a signal to the valve motor 64 to partially close the vanes 62, thereby restricting flow of gas into the vacuum pump 14. The valve 60 is not completely closed since some vacuum pumping is required to remove gas leaking into the chamber and outgassing products. The pressure control apparatus maintains the pressure in the chamber at the level $P_C$ for the remainder of the ion implantation cycle. The pressure control apparatus can be inhibited when wafers are not being implanted, thereby permitting the pressure to return to the baseline level $P_B$. In an example of the system described above, the baseline pressure $P_B$ is on the order of $5 \times 10^{-7}$ torr, while the intermediate pressure $P_c$ is in the range of $2 \times 10^{-6}$ to $4 \times 10^{-6}$ torr. It will be understood, however, that the baseline pressure $P_B$ and the intermediate pressure $P_C$ can be established at any desired level in accordance with the present invention.

It can be seen from FIG. 3 that the pressure during implantation is maintained more or less constant. Therefore, a dose correction for that pressure level $P_C$ can be calculated or determined empirically, and added to the measured dose. The resulting dose measurement and applied dose are thereby improved in accuracy.

While there has been shown and described what is at present considered the preferred embodiments of the invention, it will be obvious to those skilled in the art that various changes and modifications may be made therein without departing from the scope of the invention as defined by the appended claims.

What is claimed is:

1. Ion implantation apparatus comprising:
    a processing chamber;
    means for evacuating the chamber to a baseline pressure;
    means for introducing a workpiece into the chamber thereby causing an undesired increase in chamber pressure;
    means for directing a beam of positively charged ions at the workpiece; and
    means for controlling the pressure in the chamber after introduction of the workpiece within a specified intermediate pressure range higher than said baseline pressure, thereby reducing pressure variations during implantation.

2. Ion implantation apparatus as defined in claim 1 wherein said evacuation means comprises a vacuum pump and said pressure control means comprises valve means for controlling the flow of gas from said chamber to said vacuum pump, sensing means for sensing the pressure in said chamber, and valve control means responsive to said sensing means for controlling said valve means to maintain the pressure in the chamber within the specified intermediate pressure range.

3. Ion implantation apparatus as defined in claim 2 further including means for measuring the cumulative ion dose implanted in the workpiece, said measuring means including a charge collection device.

4. Ion implantation apparatus as defined in claim 1 wherein ion implantation is performed only when the pressure in the processing chamber is controlled within said specified intermediate pressure range.

5. A method for ion implantation comprising:
    evacuating a processing chamber to a baseline pressure;
    introducing a workpiece into the chamber thereby causing an undesired increase in chamber pressure;
    directing a beam of positively charged ions at the workpiece; and
    controlling the pressure in the chamber after introduction of the workpiece within a predetermined intermediate pressure range higher than said baseline pressure thereby reducing pressure variations during implantation.

6. The method as defined in claim 5 wherein said step of controlling the pressure in the chamber includes the steps of sensing the pressure in the chamber and controlling the flow of gas from the chamber to a vacuum pump in response to the sensed pressure so as to maintain the chamber pressure within the specified intermediate pressure range.

7. The method as defined in claim 6 wherein the step of directing a beam of ions at the workpiece includes enabling the beam to implant the workpiece only when the pressure in the chamber is within the specified intermediate pressure range.

8. The method as defined in claim 6 further including the step of measuring the cumulative ion dose implanted in the workpiece utilizing a charge collection device.

* * * * *